United States Patent [19]

Schiller

[11] Patent Number: 4,850,035

[45] Date of Patent: Jul. 18, 1989

[54] METHOD AND APPARATUS FOR REGULATING A SINGLE SIDEBAND UP CONVERTER

[75] Inventor: Wolfgang Schiller, Flein, Fed. Rep. of Germany

[73] Assignee: ANT Nachrichtentechnik GmbH, Backnang, Fed. Rep. of Germany

[21] Appl. No.: 41,294

[22] Filed: Apr. 22, 1987

[30] Foreign Application Priority Data

Apr. 22, 1986 [DE] Fed. Rep. of Germany ....... 3613536

[51] Int. Cl.$^4$ .............................................. H04B 1/16
[52] U.S. Cl. .................... 455/109; 455/118; 455/186; 455/323
[58] Field of Search ............... 455/109, 118, 183, 185, 455/186, 323, 332, 313, 47, 112, 119, 180, 330; 375/77, 50, 51, 61; 332/45

[56] References Cited

U.S. PATENT DOCUMENTS

| | | | |
|---|---|---|---|
| 4,293,825 | 10/1981 | Cerra | 455/118 |
| 4,346,479 | 8/1982 | Weber | 455/313 |
| 4,414,686 | 11/1983 | Lenz | 455/118 |
| 4,475,242 | 10/1984 | Rafal et al. | 455/109 |
| 4,511,864 | 4/1985 | de Riviere | 455/109 |
| 4,593,411 | 6/1986 | Schiller | 455/109 |
| 4,628,506 | 12/1986 | Sperlich | 455/12 |
| 4,679,243 | 7/1987 | McGeehan et al. | 455/118 |
| 4,726,069 | 2/1988 | Stevenson | 375/61 |

FOREIGN PATENT DOCUMENTS 3344318  5/1985  Fed. Rep. of Germany .

OTHER PUBLICATIONS

Ellwanger, Gerhard, "Sender und Empfänger", (Transmitter and Receiver), ANT Nachrichtentechnische Berichte Heft, Dec. 2, 1985, pp. 23–32).

Primary Examiner—Robert L. Griffin
Assistant Examiner—Curtis Kuntz
Attorney, Agent, or Firm—Spencer & Frank

[57] ABSTRACT

To regulate a single sideband up converter having a pair of mixer stages (M1, M2), each mixer stage receives control signals to compensate for spurious signals of the mixer components. Part of the radio frequency output signal (RF') from the converter is fed to a down converter (M3). From the resulting down-converted signal, the original intermediate frequency signal (IF) as well as the first harmonic thereof are filtered out as a measure of oscillator and sideband suppression. From these filtered-out signals, control signals for the mixer stages (M1, M2) are obtained.

11 Claims, 4 Drawing Sheets

METHOD AND APPARATUS FOR REGULATING A SINGLE SIDEBAND UP CONVERTER

BACKGROUND OF THE INVENTION

The present invention relates to a method of regulating a single sideband up converter of the type which includes two mixer stages and which is supplied with an oscillator signal having a preselected frequency and with an intermediate frequency signal that is to be converted, each mixer stage additionally receiving control signals to compensate for spurious signals of the mixer components. As used herein the term "spurious signals" includes one or more of the electrical changes which may occur due to component aging, stray capacitance or inductance resulting in frequency variations, temperature effects, and changes in oscillator signal level. The invention also relates to an arrangement for implementing the method.

In connection with single sideband up converters it is often necessary to suppress high interference, particularly in radio communications devices employing higher valued types of digital modulation, such as, for example, 64 QAM (quadrature amplitude modulation) and 256 QAM. In the past, the undesired sideband signal was filtered out by means of a multi-circuit bandpass filter tuned to the RF channel (see ANT Nachrichtentechnische Berichte [Communications Technology Reports issued by ANT], No. 2, December, 1985, page 27). Today, because of the use of single sideband mixers and control of oscillator suppression by way of PROMs and D/A converters (see U.S. Pat. No. 4,593,411) this is no longer necessary.

SUMMARY OF THE INVENTION

It is an object on the present invention, based on a single sideband up converter of the type mentioned above, to provide a method which permits good spurious signal suppression with broadband frequency tuning, and which additionally permits compensation for changes, as they may occur (for example, due to aging, frequency response, temperature, and changes in level). Another object is to provide an arrangement for implementing this method.

This is accomplished, with respect to the method, by feeding part of the converter output signal to a down converter, filtering the original intermediate frequency signal and at least a multiple thereof out of the down converted signal to obtain a measure of oscillator and sideband suppression, and obtaining control signals for the mixer stages from the filtered-out signals.

The present invention makes it possible to regulate out changes due to aging, frequency response, temperature and changes in level, while simultaneously providing a high degree of spurious signal suppression and broadband tunability. The single sideband converter disclosed in U.S. Pat. No. 4,593,411 provides for oscillator suppression and broadband tunability, but image frequency suppression is not sufficiently high and changes as they may occur (for example, due to aging, frequency response, temperature, and level changes) cannot be detected. In a standard single sideband converter with a connected sideband filter it is not possible to change frequency without changing filters. Moreover, such a sideband filter must meet high demands with respect to frequency response and delay. In a conventional single sideband converter, it is possible to set and optimize spurious signal suppression for a fixed operating frequency but the above-mentioned changes cannot be considered. A new adjustment and optimization must be made for each change of frequency.

Based on the down conversion of the converter output signal according to the present invention, oscillator suppression and the undesired sideband (image frequency) can be regulated to below a certain value, e.g. $-35$ to $-40$ dB. The advantage of the present invention is the use of the radio frequency signal as the oscillator frequency for down converting the interference signals, in contrast to the use of the oscillator signal for the mixer stages in a conventional converter, for example as disclosed in German Pat. No. 3,344,318.

DESCRIPTION OF THE PREFERRED EMBODIMENT

Figure 1:
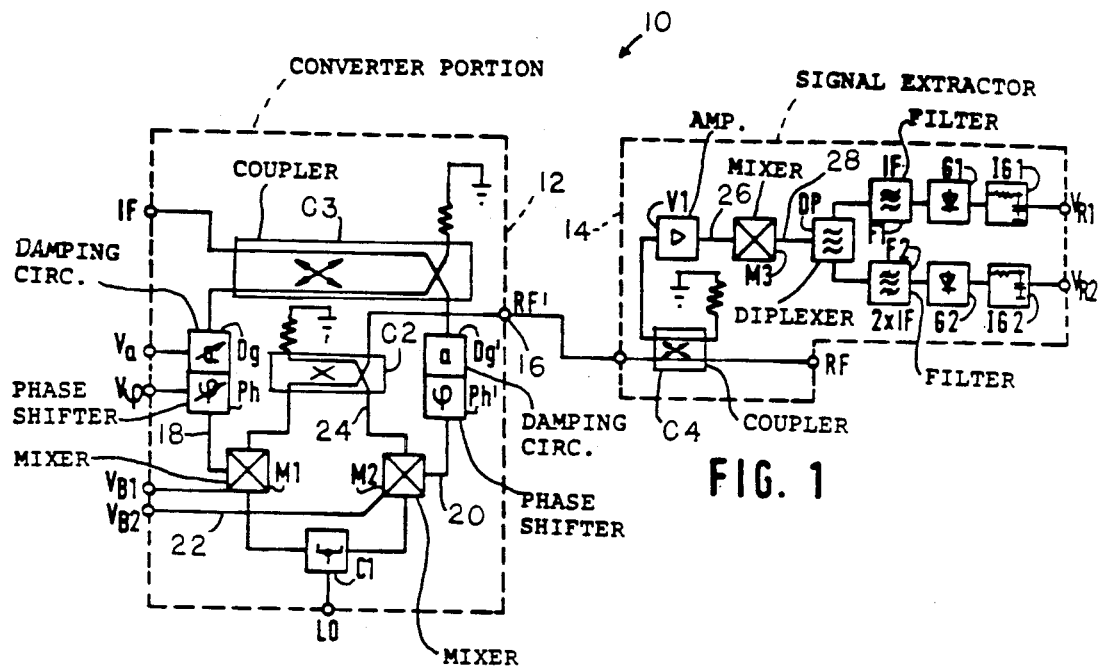
FIG. 1 is a basic block diagram of a single sideband up converter for implementing the method of the present invention.

The basic circuit diagram of the single sideband up converter 10 according to the invention is shown in FIG. 1, and includes a converter portion 12 and a signal extractor 14. The essential circuit of up converter 10 is composed of two mixer stages (balanced mixers) M1 and M2. The intermediate frequency signal IF to be converted is applied to an input terminal and is conducted through a 3 dB/90° coupler C3, in each case via a damping circuit Dg or Dg' and a phase shifter Ph or Ph', to one of mixer stages M1 and M2, respectively. By way of an input terminal and power splitter C1, an oscillator signal LO of preselectable frequency is fed to the two mixer stages M1 and M2. The outputs of mixer stages M1 and M2 are connected with a 3 dB/90° coupler C2 having an output which is connected to a terminal 16. The radio frequency signal RF'—the converter output signal—is obtained at terminal 16. Terminal 16 is connected to an input terminal of signal extractor 14. A small portion of radio frequency signal RF' is coupled out by a coupler C4. The coupled-out radio frequency signal RF' is amplified, if required, in an amplifier stage V1. The possibly amplified signal controls a down converter M3. Thus, radio frequency signal RF' serves as oscillator frequency for down converter M3, which is designed as a single-ended mixer. The undesired interference signals (the undesired sideband and oscillator signal LO for the two mixer stages M1 and M2) are converted by means of down converter M3 to the intermediate frequency position. The output signal of down converter M3 passes through a diplexer DP to a filter F1 for the intermediate frequency IF and a filter F2 for the first harmonic, i.e. double the intermediate frequency 2×IF. These filtered-out signals are rectified by means of rectifiers G1 and G2, are possibly amplified, and are integrated by means of integration members IG1 and IG2, which are connected respectively to output terminals of signal extractor 14. The voltages $V_{R1}$ and $V_{R2}$ at the output terminals are a measure of the oscillator and sideband suppression of the converter portion 12. The major portion of radio frequency signal RF', after a minor portion has been extracted to generate voltages $V_{R1}$ and $V_{R2}$, is available as radio frequency signal RF at an output terminal of signal extractor 14.

Voltages $V_{R1}$ and $V_{R2}$ are fed to a microcomputer equipped with interface circuits (FIG. 2) so as to produce control signals $V_{B1}$ and $V_{B2}$ for mixer stages M1 and M2 as well as control signals $V_a$ and $V_\phi$ for controllable damping circuit Dg and controllable phase shifter Ph. These control signals are applied to input terminals of converter portion 12. The controllable damping circuit Dg and the controllable phase shifter Ph are disposed in the intermediate frequency branch between coupler C3 and mixer M1, whereas a permanently set damping member Dg' and a permanently set phase shifter Ph' are disposed in the branch between coupler C3 and mixer M2. Control signals $V_{B1}$ and $V_{B2}$ are fed to the mixer diodes of mixer stages M1 and M2 (FIG. 5) as direct control direct voltages for the suppression of the oscillator signal LO. Control signals $V_\phi$ and $V_a$ serve to set the phase of phase shifter Ph and to set the attenuation of damping circuit Dg. The configuration of these components will be described in detail in connection with FIG. 4. In order to realize quasi-complete sideband suppression and to be able to compensate for all phase and amplitude errors of converter portion 12, it is necessary for phase shifter Ph to be electronically tunable over ±20° and damping circuit Dg must be electronically tunable over ±1.5 dB.

Figure 2:
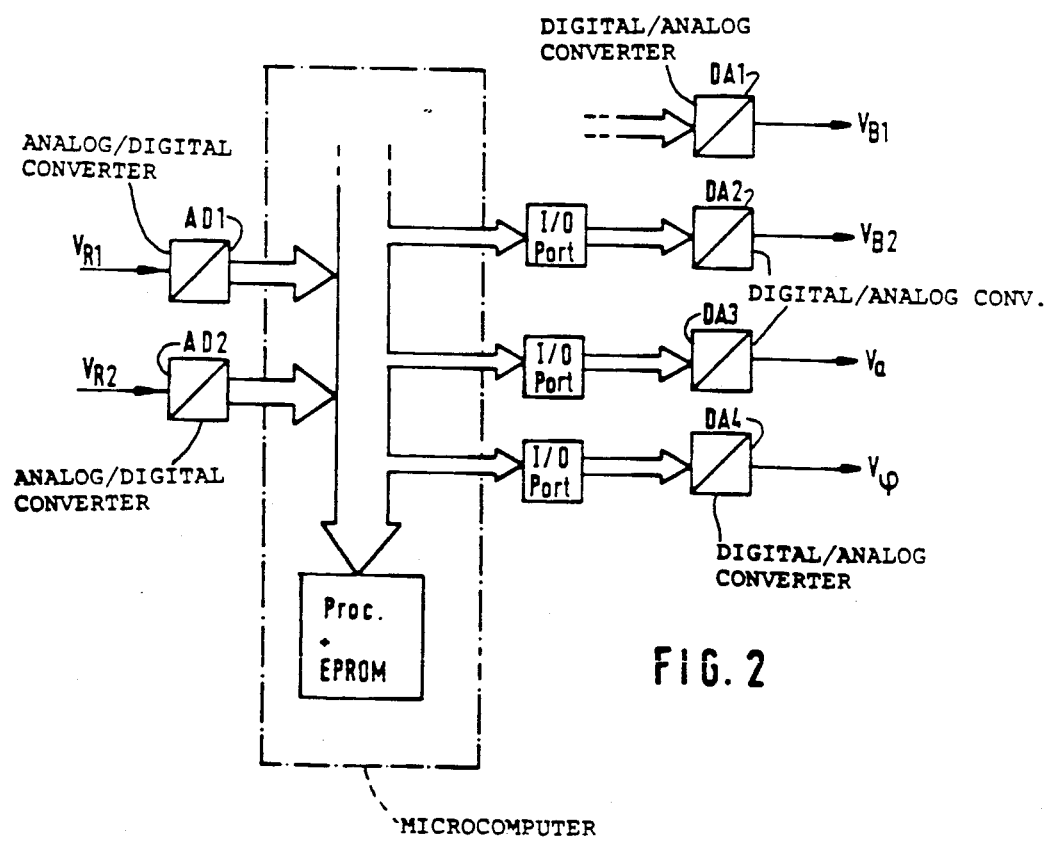
FIG. 2 is a block diagram schematically illustrating a microcomputer and interface circuitry for generating control signals for use by the converter portion of FIG. 1 on the basis of signals obtained from the signal extractor of FIG. 1.
Figure 3:
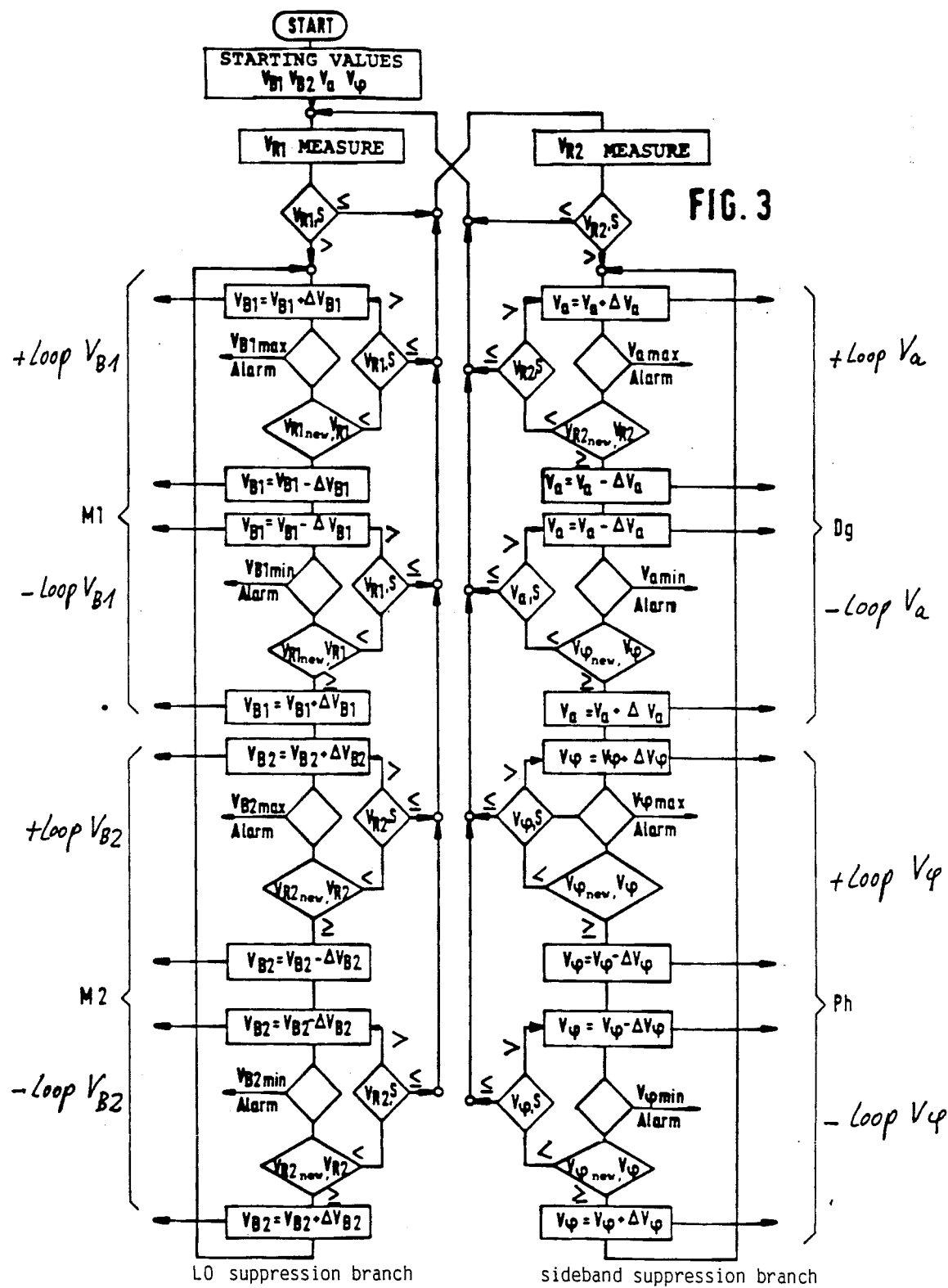
FIG. 3 is a flow chart for signal processing by the microcomputer of FIG. 2.

The basic configuration of the microcomputer with interface circuits is shown in FIG. 2. Voltages $V_{R1}$ and $V_{R2}$ from signal extractor 14 are each fed to an A/D converter AD1 and AD2, respectively. Integrated components of type ADC 0804, for example, can be used for the A/D converters. The A/D converted signals are fed to the bus of a microcomputer. An Intel computer model 8748 is suitable for the microcomputer. Signal processing in this microcomputer takes place according to the flow chart of FIG. 3. Initially, the starting values $V_{B1}$, $V_{B1}$, $V_a$ and $V_\phi$ are given. These values are selected so that the corresponding regulating voltages with respect to $V_{B1}$ and $V_{B2}$ are 0. Other initial values are given for $V_a$ and $V_\phi$. After measuring the values for $V_{R1}$ and $V_{R2}$, a comparison is made with a threshold value S. As long as the measured values $V_{R1}$ and $V_{R2}$ are less or equal the threshold value, no new control voltages need to be calculated. In case of insufficient suppression, the $V_{B1}$ loop will be adjusted to maximum suppression, unless the threshold value S in not reached before. After that, the $V_{B2}$ loop will be adjusted to maximum suppression, unless the threshold value S is not reached before. The absolute maximum suppression of the LO-suppression branch is achieved by adjusting alternatively the $V_{B1}$ and $V_{B2}$ loops to their local maxima. The sideband-suppression branch is adjusted in the same way by the $V_a$ and $V_\phi$ loops. Absolute maximum suppression values need not to be reached in both branches unless the threshold value S is exceeded. This threshold value S is assumed to be between $-35$ and $-40$ and dB. As shown by the flow chart, a new computing value is determined in that a $\Delta$ value ($\Delta V_{B1}$, $\Delta V_{B2}$, $\Delta V_a$, $\Delta V_\phi$) is always added or subtracted, respectively, and a new comparison is made. With a store of values of, for example, 256 binary stages, these $\Delta$ values may just correspond to one binary stage. If a comparison in a corresponding decision loop of the flow diagram no longer produces a deviation, the last calculated value will be transferred, as a word having a width of 8 bits, to an I/O port. Intel modules 8225A can be used for the I/O ports. If the value range is exceeded, an alarm can be given via respective outputs. D/A converters DA1 to DA4, for example 1408, are connected to the I/O ports. Control voltages $V_{B1}$, $V_{B2}$, $V_a$, $V_\phi$ can be obtained via possibly required operational amplifiers (not illustrated), e.g. 4741.

Figure 4:
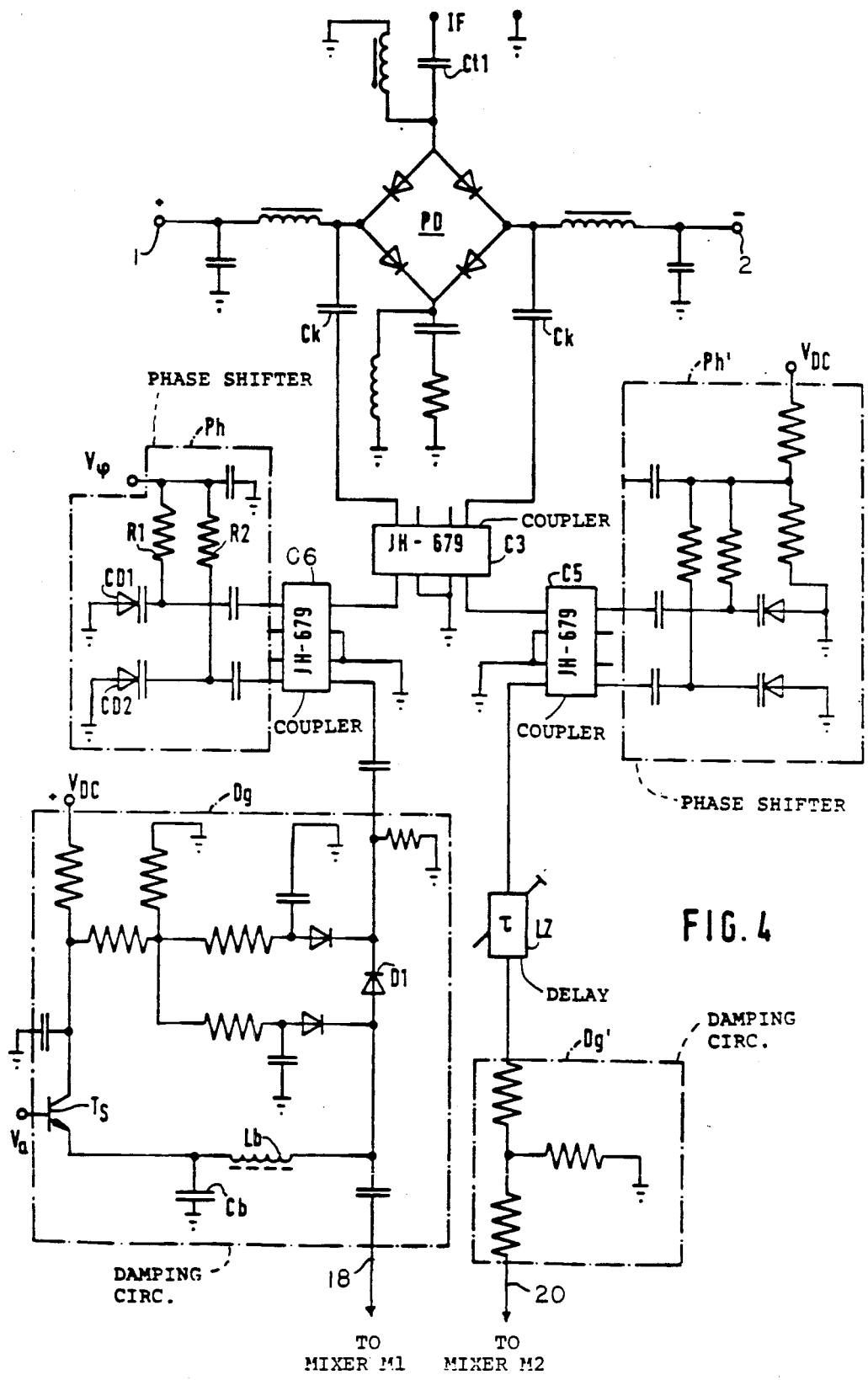
FIG. 4 is a schematic circuit diagram illustrating detailed circuitry for the intermediate frequency section of the converter portion of FIG. 1.

Detailed circuitry for the intermediate frequency section of converter portion 12 is shown in FIG. 4. Intermediate frequency signal IF is fed via a direct current isolating capacitor Ct1 to a diode bridge PD composed of four PIN diodes. Each branch of PIN diode bridge Pd is switchable via on input terminal 1 or 2, respectively. By actuating input terminal 1 with a positive potential or input terminal 2 with a negative potential, it is possible to select the sideband (LSB/USB) to be suppressed. By way of coupling capacitors Ck, the two outputs of the PIN diode bridge PD are connected to the inputs of the 3 dB/90° coupler C3. The two outputs of coupler D3 each lead to one of the phase shifters Ph or Ph'. The phases of phase shifter Ph can be set by means of control signal $V_\phi$, while phase shifter Ph' is permanently set by voltage $V_{DC}$. Phase shifter Ph is controlled by changing the bias of the two variable capacitance diodes CD1 and CD2 in dependence on the control voltage $V_\phi$ via resistors R1 and R2. Phase shifter Ph' has an identical configuration. Inclusion of the two phase shifters in the intermediate frequency section is likewise effected by way of 3 dB/90° couplers C5 and C6. For an intermediate frequency $f_{ZF}=140MHZ$, for example, JH-679 modules can be used for these 3 dB/90° couplers. Controllable damping circuit Dg is composed of a transistor stage Ts whose base receives the control signal $V_a$. In the longitudinal branch of the controllable damping circuit Dg, i.e. between the output of controllable phase shifter Ph and the input of mixer stage M1, there is disposed a diode D1. The anode and cathode of this diode D1 are each connected via an RC member and a further diode to the collector of transistor stage Ts and to a direct supply voltage $V_{DC}$. The emitter of transistor stage Ts is connected via an HF blocking member Cb, Lb to the anode of diode D1. The anode of diode D1 is additionally connected via a capacitor to a conductor 18 leading to mixer stage M1. The fixed damping circuit Dg' between phase shifter Ph' and mixer stage M2 is composed of a T-shaped resistor network, which is connected to mixer stage M2 by way of conductor 20. To compensate for possible differences in delay in the two intermediate frequency branches, this T-shaped resistor network has an adjustable delay member LZ connected upstream of it. The intermediate frequency signals $IF1_{out}$ and $IF2_{out}$ are available respectively on conductors 18 and 20 to actuate mixer stages M1 and M2.

Figure 5:
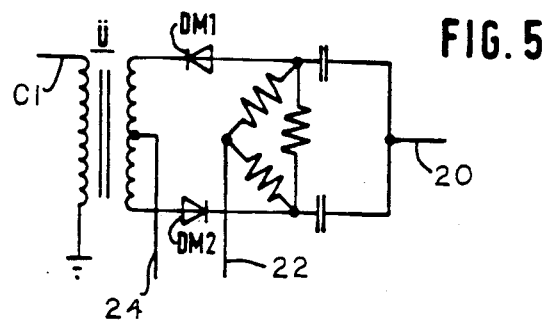
FIG. 5 is a schematic circuit diagram for one of the mixer stages in the converter portion of FIG. 1, the other mixer stage having identical circuitry.

The configuration of mixer stage M2 is shown in FIG. 5 (the circuitry for mixer stage M1 is identical). Oscillator signal LO is fed into the primary of a transformer Ü via conductor C1. The secondary of transformer Ü is connected with mixer diodes DM1 and DM2, namely the one end with the cathode and the other end with an anode of a mixer diode. The ends of the mixer diodes DM1 and DM2 facing away from transformer Ü are connected with one another via direct voltage isolating capacitors. At this connecting point, the IF signal to be converted (IF2$_{out}$) is fed in via conductor 20. The direct control voltage V$_{B2}$ is fed in via a conductor 22 and a resistor triangle circuit. Two corners of the triangle circuit are connected to the connecting points between mixer diodes DM1 and DM2 and the direct voltage isolating capacitors. The direct control voltage V$_{B2}$ is supplied to the third corner of the triangle circuit. Radio frequency signal RF' is obtained at the center tap of the secondary winding of transformer Ü via conductor 24. High barrier silicon Schottky diodes are preferred as mixer diodes DM1 and DM2. One diode (DM1 or DM2) is biased by control voltage V$_{B2}$ to the extent that a current of 0 to a maximum of 3 mA is able to flow.

Figure 6:
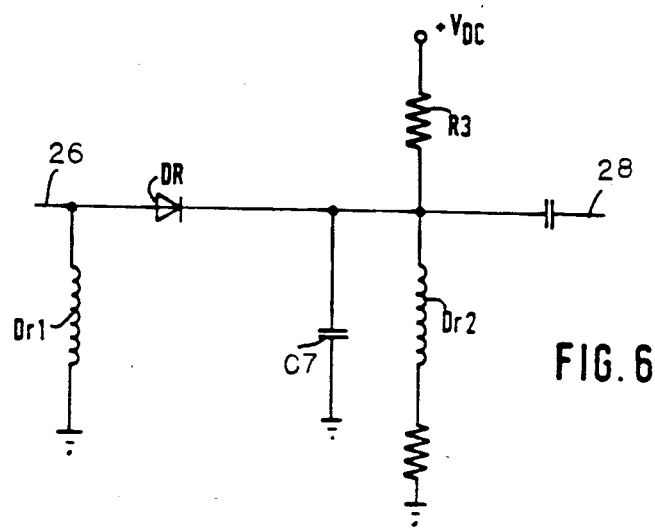
FIG. 6 is a schematic circuit diagram for the mixer in the signal extractor in FIG. 1.

As shown in FIG. 6, down converter M3 is a single-ended mixer which is advisably composed of half a mixer stage M1 or M2. This single-ended mixer includes only one down converter diode DR. Radio frequency signal RF' is fed directly to the anode of the mixer diode DR via conductor 26. A choke Dr1 at the radio frequency RF' signal. A choke Dr2 blocks the IF voltage in the direct current path. Capacitor C7 represents a short circuit for the radio frequency signal RF'. A fixed bias for down mixer diode DR is supplied via resistor R3. The output signal is provided via conductor 28.

Figure 7:
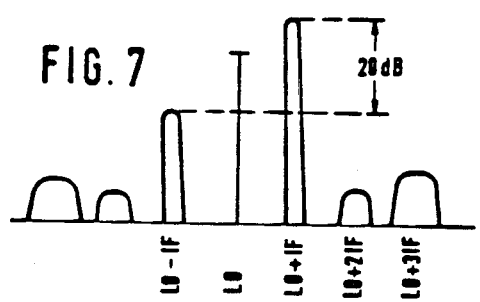
FIG. 7 shows the output signal spectrum of a conventional single sideband up converter.

FIG. 7 shows the output signal spectrum of a conventional QAM modulated single sideband up converter. The desired sideband LO+IF projects only slightly above the level of the undesired oscillator frequency LO. The undesired sideband LO−IF is reduced by 20 dB.

Figure 8:
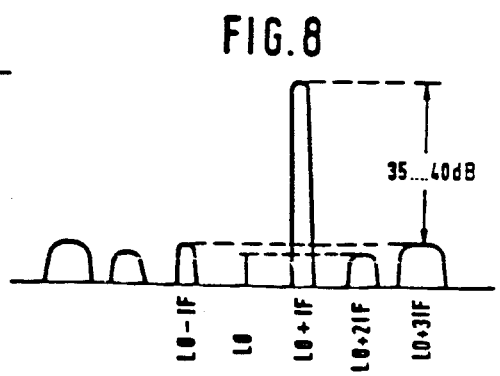
FIG. 8 shows the output signal spectrum of the single sideband up converter according to the present invention.

FIG. 8 shows the output signal spectrum of a QAM modulated single sideband up converter according to the present invention. The undesired sideband LO−IF, together with the local oscillator remainder LO are reduced by 35 to 40 dB compared to the desired sideband LO+IF. The undesired sideband can also be chosen to LO+IF, by actuating opposite polarities at input terminals 1 and 2 as discussed in conjunction with FIG. 4.

Broadband frequency tuning of the converter 10 is available; it is merely necessary to change the frequency of the oscillator signal LO, without requiring any filtering or subsequent circuit tuning. Changes due to temperature, aging, changes in level, and frequency response are regulated out. The microcomputer replaces a complicated analog control system. The required signal to noise ratios of 28 dB for 64 QAM and 36 dB for 256 QAM are met or even far exceeded.

It will be understood that the above description of the present invention is susceptible to various modifications, changes and adaptations, and the same are intended to be comprehended within the meaning and range of equivalents of the appended claims.

What I claim is:

1. A method for regulating a single sideband up converter which receives an oscillator signal having a preselected frequency and an intermediate frequency signal to be converted and which generates a radio frequency converter output signal in response thereto, the up converter including two mixer stages which receive control signals to compensate for spurious signals from the mixer stages, the up converter additionally including an intermediate frequency circuit having a controllable phase shifter and a controllable damping circuit electrically connected to one of the mixer stages, the controllable phase shifter and controllable damping circuit being responsive to additional control signals, said method comprising the steps of:
   (a) supplying part of the converter output signal to a down converter to generate a down-converted signal;
   (b) generating filtered-out signals by filtering the intermediate frequency signal and a signal having a frequency that is double the intermediate frequency out of the down-converted signal; and
   (c) generating the control signals for the mixer stages from the filtered-out signals, and generating the additional control signals for the controllable phase shifter and the controllable damping circuit out of the down-converted signal.

2. The method of claim 1, wherein step (c) is conducted using a microcomputer.

3. The method of claim 2, wherein the intermediate frequency circuit of the up converter additionally includes a PIN diode bridge circuit which receives the intermediate frequency signal that is to be converted, and further comprising the step of selectively applying a signal to the PIN diode bridge circuit to determine the sideband to be suppressed.

4. The method of claim 1, wherein the intermediate frequency circuit of the up converter additionally includes a PIN diode bridge circuit which receives the intermediate frequency signal that is to be converted, and further comprising the step of selectively applying a signal to the PIN diode bridge circuit to determine the sideband to be suppressed.

5. The method for claim 1, wherein the intermediate frequency circuit has a PIN diode bridge circuit which receives the intermediate frequency signal that is to be converted, and further comprising the step of selectively applying a signal to the PIN diode bridge circuit to determine the sideband to be suppressed.

6. A single sideband up converter, comprising:
   converter means for receiving an oscillator signal having a preselected frequency and an intermediate frequency signal which is to be converted and for generating a radio frequency converter output signal in response thereto, the converter means including two mixer stages which receive control signals to compensate for spurious signals from the mixer stages;
   a down converter;
   first means for supplying part of the converter output signal to the down converter to generate a down-converted signal, the first means including coupling means, having an input port to receive the converter output signal, for transferring radio frequency energy to the down converter;
   second means for generating filtered-out signals by filtering the intermediate frequency signal and at least one multiple thereof out of the down-converted signal, the second means including a first rectifier, a second rectifier, a first filter tuned to the intermediate frequency connected between the first rectifier and the down converter, and a second filter tuned to double the intermediate frequency connected between the second rectifier and the down converter; and third means for generating the control signals for the mixer stages from the filtered-out signals.

7. The up converter of claim 6, wherein the third means comprises a microcomputer, means for electrically connecting the rectifiers to the microcomputer, and means for electrically connecting the microcomputer to the mixer stages.

8. The up converter of claim 7, further comprising transfer means for transferring a portion of the intermediate frequency signal to one of the mixer stages, the transfer means including a controllable phase shifter having an input port to receive additional control signals, and means for electrically connecting the microprocessor to the input port of the controllable phase shifter.

9. The up converter of claim 8, wherein the transfer means additionally comprises a controllable damping circuit having an input port to receive additional control signals, and means for electrically connecting the microprocessor to the input port of the controllable damping circuit.

10. The up converter of claim 7, further comprising transfer means for transferring a portion of the intermediate frequency signal to one of the mixer stages, the transfer means including a controllable damping circuit having an input port to receive additional control signals, and means for electrically connecting the microcomputer to the input port of the controllable damping circuit.

11. The up converter of claim 6, further comprising selection means for determining the sideband to be suppressed, the selection means including a PIN diode bridge circuit which receives the intermediate frequency signal and a selectively applied sideband selection signal.

* * * * *